United States Patent
Reohr, Jr. et al.

(10) Patent No.: US 6,587,996 B1
(45) Date of Patent: Jul. 1, 2003

(54) DEVICE AND METHOD FOR INCREASED FAULT COVERAGE USING SCAN INSERTION TECHNIQUES AROUND SYNCHRONOUS MEMORY

(75) Inventors: Richard D. Reohr, Jr., Hillsboro, OR (US); Brian M. Collins, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 09/593,600

(22) Filed: Jun. 12, 2000

(51) Int. Cl.[7] .............................................. G06F 17/50
(52) U.S. Cl. .................... 716/4; 716/5; 716/6
(58) Field of Search ........................ 716/1–21; 714/30, 714/718–720, 729, 731, 732, 743, 815, 726–728, 733–736, 724

(56) References Cited

U.S. PATENT DOCUMENTS 5,592,493 A * 1/1997 Crouch et al. .............. 714/729
5,696,770 A * 12/1997 Lo .............................. 714/718

* cited by examiner

*Primary Examiner*—Vuthe Siek
*Assistant Examiner*—Naum Levin
(74) *Attorney, Agent, or Firm*—Antonelli, Terry, Stout & Kraus, LLP

(57) ABSTRACT

A device and method to test a circuit in a chip that has memory embedded in the chip using a scan chain. This device and method generates a known signal simultaneously to a bypass circuit and the memory onboard the chip. The bypass circuit uses a series of exclusive OR gates, a flip-flop, and a multiplexer to receive the known signal. The exclusive OR gates reduce the number of signals input so that they match the number of signals output by memory. A flip-flop is used to store the data received from the exclusive OR gates and transfer it to a multiplexer. The multiplexer receives data from memory and the flip-flop and selects which data to pass on in the circuit. When a scan test is being run on the circuit the multiplexer passes on only the data from the flip-flop. When a scan test is not being run the multiplexer only passes on the data from memory. This device and method allows for circuits to be tested using a scan chain that could not otherwise be tested due to the presence of memory embedded in the chip.

18 Claims, 4 Drawing Sheets

DEVICE AND METHOD FOR INCREASED FAULT COVERAGE USING SCAN INSERTION TECHNIQUES AROUND SYNCHRONOUS MEMORY

FIELD

The invention generally relates to a device and method to increase fault tolerance using scan insertion techniques around synchronous memory. More particularly, the invention relates to a device and method to enable increased fault coverage using scan insertion techniques around synchronous random access memory (RAM) isolated by a built-in self test (BIST) wrapper.

BACKGROUND

Advances in chip manufacturing technology have enabled rapid progress to be seen in the speed, size and cost of computer systems. At one time it would have been considered impossible to put a sizable amount of memory on a single chip. Today not only is it possible to have a large amount of memory on a single chip, it is also possible for the circuitry for a device or a communications controller to be placed on a single chip and also have a significant amount of embedded memory in the form of SRAM on the same chip.

However, as the ability to pack more circuits, transistors and memory on a single chip has increased, so has the complexity of the logic and circuitry used in these chips. With the rapid increase in the complexity of the chip, software has been developed to aid the electrical engineer in the design and testing of the logic used in the design. These software chip development tools have made the task of designing large complex chips easier since the software can simulate the logic and design errors can be more easily detected.

However, the software chip development tools are not perfect and a simulation, even though extremely useful, is not a substitute for building a prototype. Therefore, when the design of a complex chip is finalized, prototypes are built and tested. However, these chips are very complex and by merely checking the input to the chip and the output from the chip, it is not possible to identify the specific design or manufacturing error on the chip.

Therefore, most large chip designs use automatic scan insertion techniques built directly in the chip to provide high levels of fault coverage. Fault coverage is the ability to detect when an internal node within the chip is either "stuck at one" or "stuck at zero." Such faults may be due to either design errors or manufacturing problems. These automatic scan insertion techniques will typically insert a scan chain directly on the chip at critical locations. One such scan chain is shown in FIG. 1 in which the scan chain is inserted into the chip logic by connecting all the flip-flops together. Carefully selected patterns are then shifted into the scan chain which are shifted out on the leading edge of the next clock cycle and checked for accuracy.

The scan chain shown in FIG. 1 uses multiplexer (MUX) 10 to select either scan in signal 70 or normal in signal 60 for transmission to flip-flop 20 via link 90. A clock signal 80 is used to synchronize flip-flops 20 and 50. The flip-flop 20 then generates a scan out signal 120 and a normal out signal 130. The normal out signal 130 is feed into the logic cloud 30 which generates a normal in signal 100 that feeds into MUX 40. During the operation of a scan chain test the scan out signal 120 propagates a signal that directly or indirectly connects to scan in signal 110. When a scan test is being performed the MUX 40 selects input from scan in 110. A link 140 provides a signal to flip-flop 50 that supplies a normal out signal 160 and a scan out signal 170 which also provides the results of the scan chain test.

The scan chain shown in FIG. 1 serves well to test most circuitry logic. However, where, as shown in FIG. 2, a synchronous 1 or 2 port random access memory (RAM) 220 (hereinafter "RAM") is embedded in circuit 320, then it is not necessarily the case that RAM 220 will deliver the same output data via link 300 to logic cloud 230 as input data from flip-flop 200 via link(s) 250 provided. This is due to the possibility that a write may occur via write data link 260, write address link 270, and write enable link 280 which is separate and distinct from a read occurring via read address 290. Thus, the data output from logic cloud 230 via links 310 to flip-flop 240 may not be the same as that input via flip-flop 200.

Therefore, what is needed is a device and method that will enable the testing of a circuit having embedded RAM in a single chip. This device and method should have no impact on normal operation of the circuit in the chip and should enable the operation of a scan chain to test the circuit. Further, this device should occupy a minimal amount of space on the chip and thereby allow for as much space as possible to be available for normal operations. Also, this device and method should not impact the execution speed of the chip in normal operations.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Figure 1:
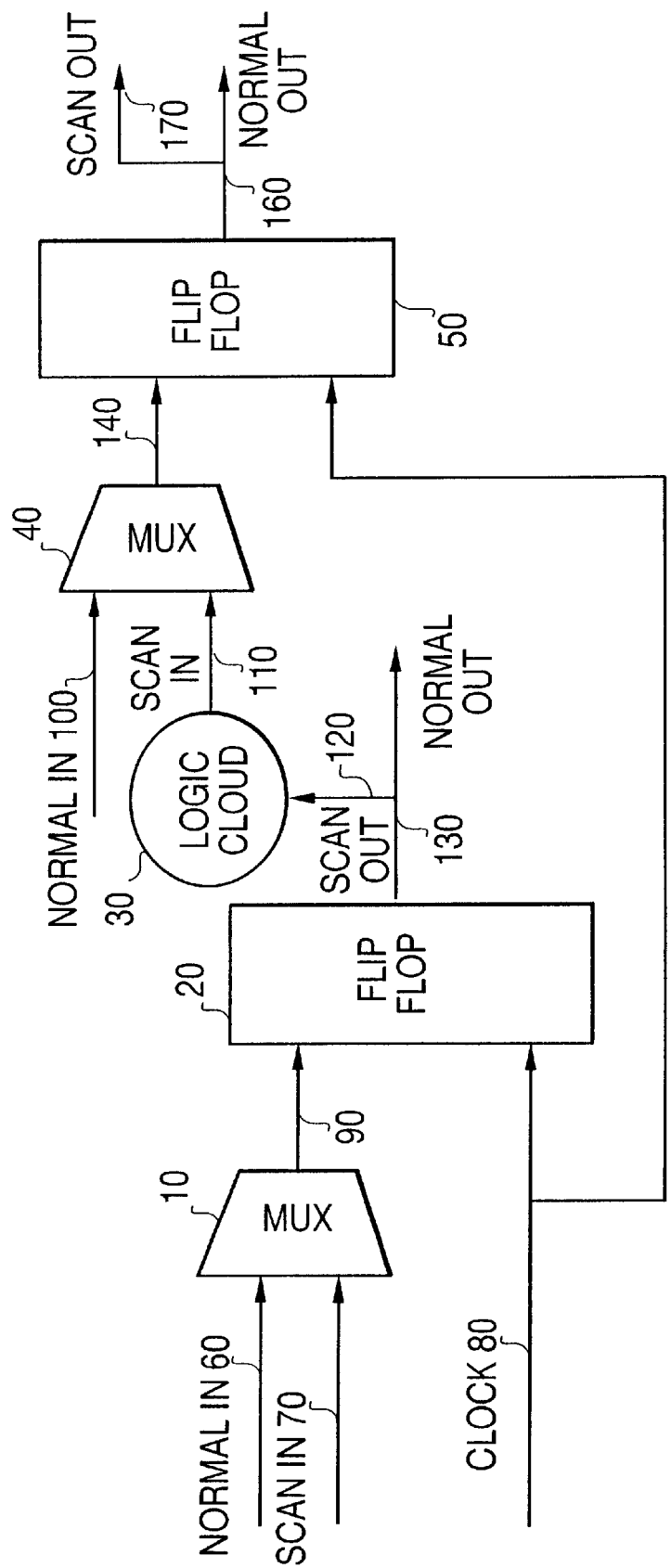
FIG. 1 is an example of a circuit on a chip having a scan chain embedded therein used to test the circuit.

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known power connections to integrated circuits and other components may not be shown within the FIGS. for simplicity of illustration and discussion, and so as not to obscure the invention.

The present invention is a device to test a circuit on a chip having memory using a scan circuit. This device has a memory embedded in the chip, a plurality of gates, a plurality of read and write signals connected to the memory and to the plurality of gates, a flip-flop connected to the plurality of gates and a multiplexer connected to the memory and the flip-flop. When a scan test is run the multiplexer will only accept input from the flip-flop and not from the memory and when the scan test is not run the multiplexer will only accept input from the memory and not from the flip-flop.

The present invention is also a method to test a circuit on a chip having memory. This method starts by generating a plurality of input signals of known value. Then feeding the plurality of input signals into memory and a bypass circuit that bypasses memory. The method then reduces the number of signals at the bypass circuit so that the number of bits output by the bypass circuit equals the number of bits output from memory. The method then receives the bits output by the bypass circuit and the memory. Finally, the method selects only the bits from the bypass circuit when a scan test is being run and selects only the bits from the memory when a scan test is not being run.

Figure 2:
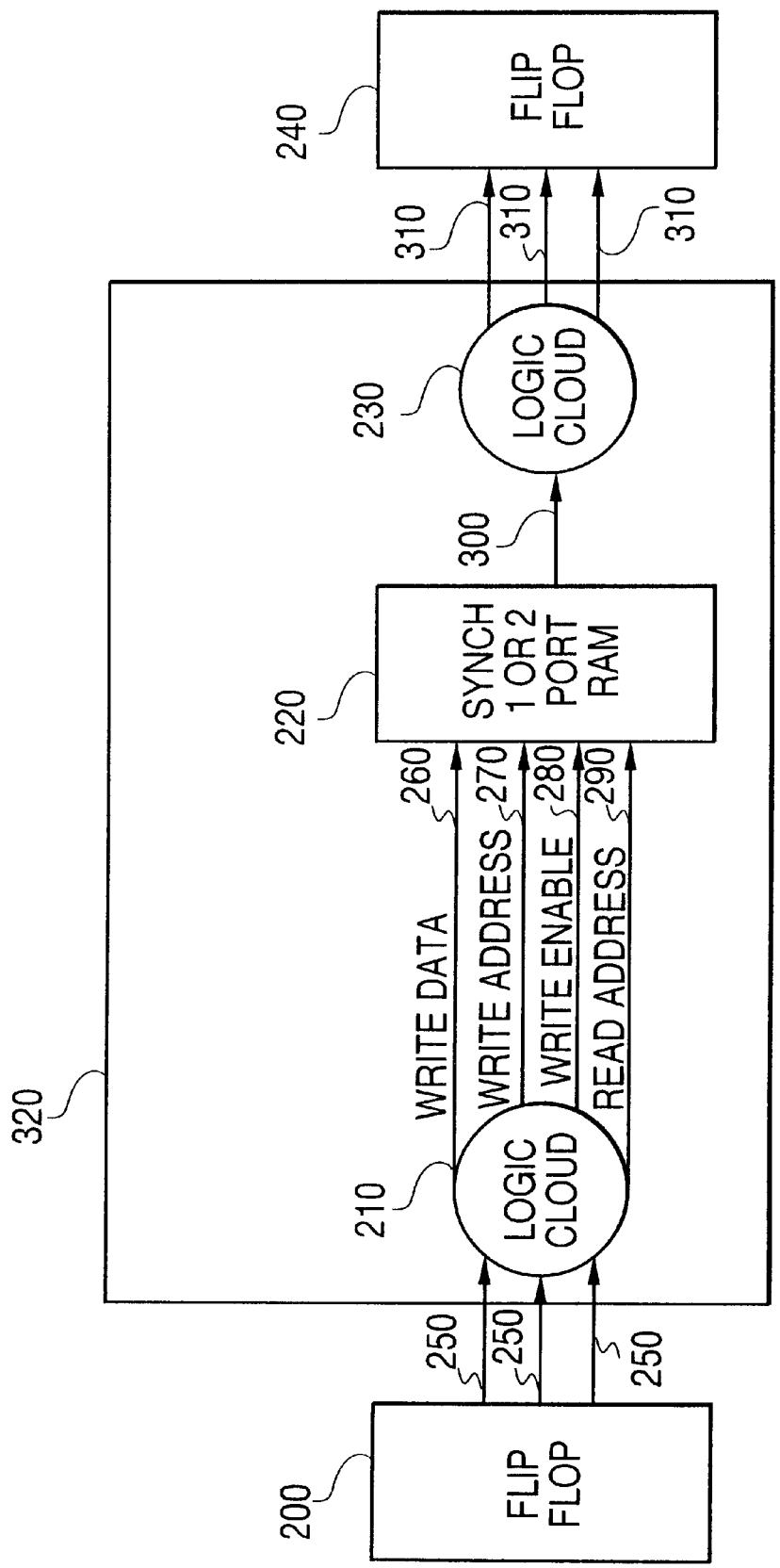
FIG. 2 is an example of a circuit on a chip in which RAM is embedded in the logic of the circuit.
Figure 3:
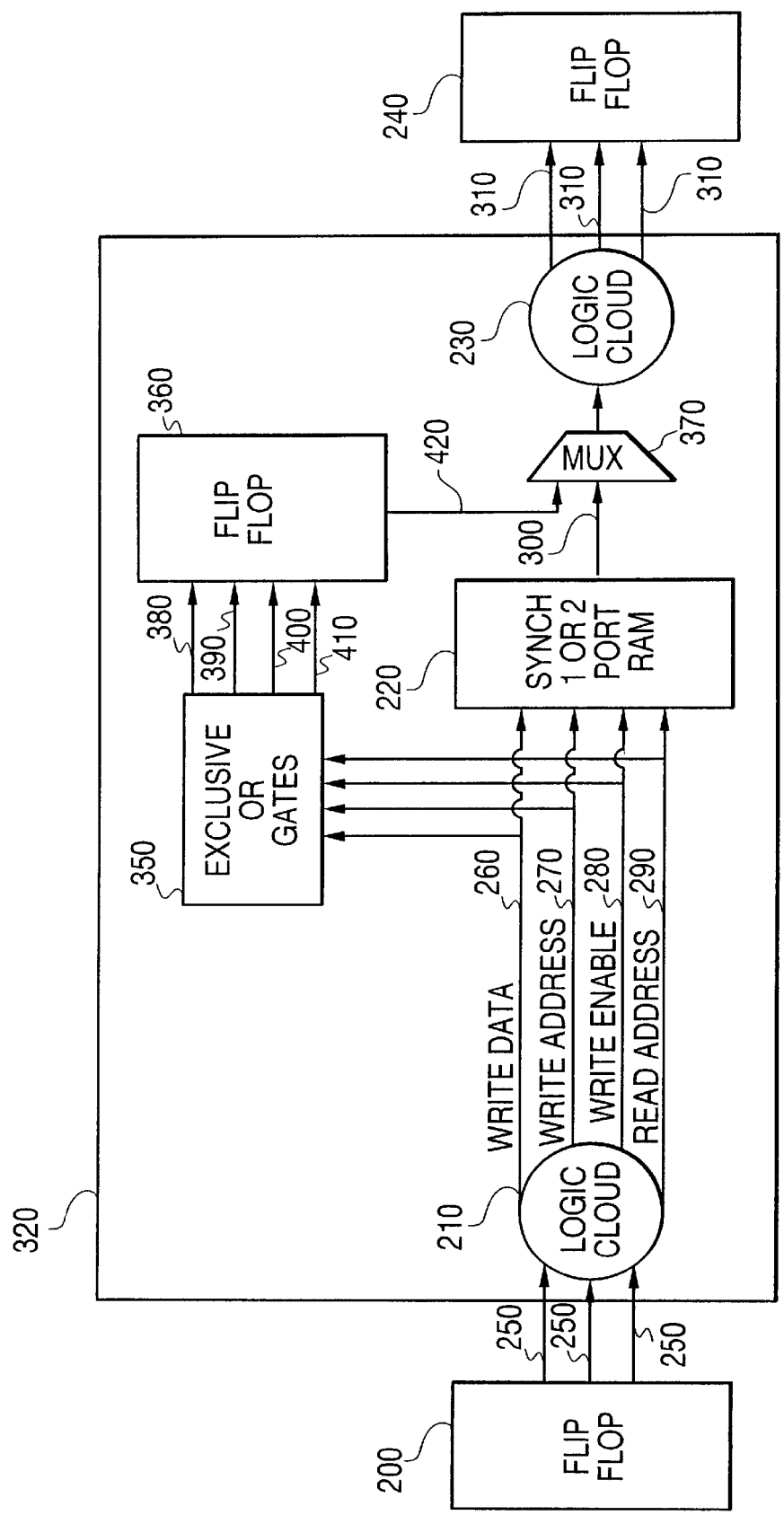
FIG. 3 is an example of a circuit on a chip having RAM embedded therein with a scan circuit designed to test the logic of the circuit in an embodiment of the present invention.

FIG. 3 is an example of a circuit 320 on a chip having RAM 220 embedded therein with a scan circuit designed to test the logic of the circuit 320 in an embodiment of the present invention. The circuit 320 shown in FIG. 3 is similar to the circuit 320 shown in FIG. 2 with three notable exceptions. First, the output from logic cloud 210 is routed through exclusive OR gates (XOR) 350 to flip-flop 360 and then to MUX 370. Using this mechanism this embodiment of the present invention provides a low cost and easy to implement circuit to bypass RAM 220. Therefore, the XOR gates 350, the flip-flop 360 and MUX 370 form a bypass circuit. By providing a series of flip-flops 200, 360 and 240 whose width is equal to data entering and leaving RAM 220, it is possible to drive the output links to known values during the scan operation. The flip-flops 200, 240, and 360 serve to store data and may be accessed for comparing and reporting purposes. Also by using exclusive OR gates 350 it is possible to reduce the input size so that it is equal to the output link 300. As will be discussed in reference to FIG. 4, it is necessary to reduce the number of signals or bits entering exclusive OR (XOR) gates 350 to match the number of signals or bits entering MUX 370 via link 300. Further, the use of exclusive OR gates 350 do not mask or block the signals received as inputs. The operation of the exclusive OR gates 350 will be discussed in further detail in reference to FIG. 4. It should be noted that the usage of exclusive OR gates is preferred since it simplifies the scan circuit. However, any type of gate including but not limited to OR gates, AND gates, and NOR gates may be used including combinations of all of these in place of XOR gates 350. Therefore, this embodiment of the present invention is not limited to the use of XOR gates 350 but may be any type of gate used singly and in combination with other gates.

Referring to FIG. 3, input to circuit 320 is from flip-flop 200 through link(s) 250 into logic cloud 210. Circuit 320, as part of a chip, is circuitry designed to perform some function, such as but not limited to, communications or as a peripheral controller. In order for the circuit 320 to efficiently operate synchronous 1 or 2 port RAM (hereinafter RAM or memory) 220 is used as temporary storage. However, the presence of RAM 220 means that a scan circuit such as shown in FIG. 1 is not possible. Further logic cloud 210 is used primarily to execute reads and writes to RAM 220 through write data link 260, write address link 270, write enable link 280 and read address link 290. The signals from write data link 260, write address link 270, write enable link 280 and read address link 290 are simultaneously feed into RAM 220 and exclusive OR gates 350. This feeding of the signals from logic cloud 210 to both the XOR gates 350 and the RAM 220 is done so that testing of the circuit 320 may be done using a scan circuit and normal operations will not be interfered with or prevented. In both a normal operation and a scan circuit operation the result of the operation is passed from RAM 220 to MUX 370 through link 300.

Simultaneously with the data being passed to RAM 220 it is also passed to XOR gates 350 though write data link 260, write address link 270, write enable link 280 and read address link 290, as previously discussed. Thereafter, the XOR gates 350, as will be discussed in further detail in reference to FIG. 4, passes the processed data through links 380, 390, 400, and 410 to flip-flop 360. Then flip-flop 360 passes the received data to MUX 370. When a scan test is being run MUX 370 will only accept data coming from flip-flop 360. However, under normal operations MUX 370 will only accept data from RAM 220 via link 300. Using this mechanism it is possible for the scan circuit to bypass RAM 220 without interfering or slowing the normal operations of circuit 320.

Figure 4:
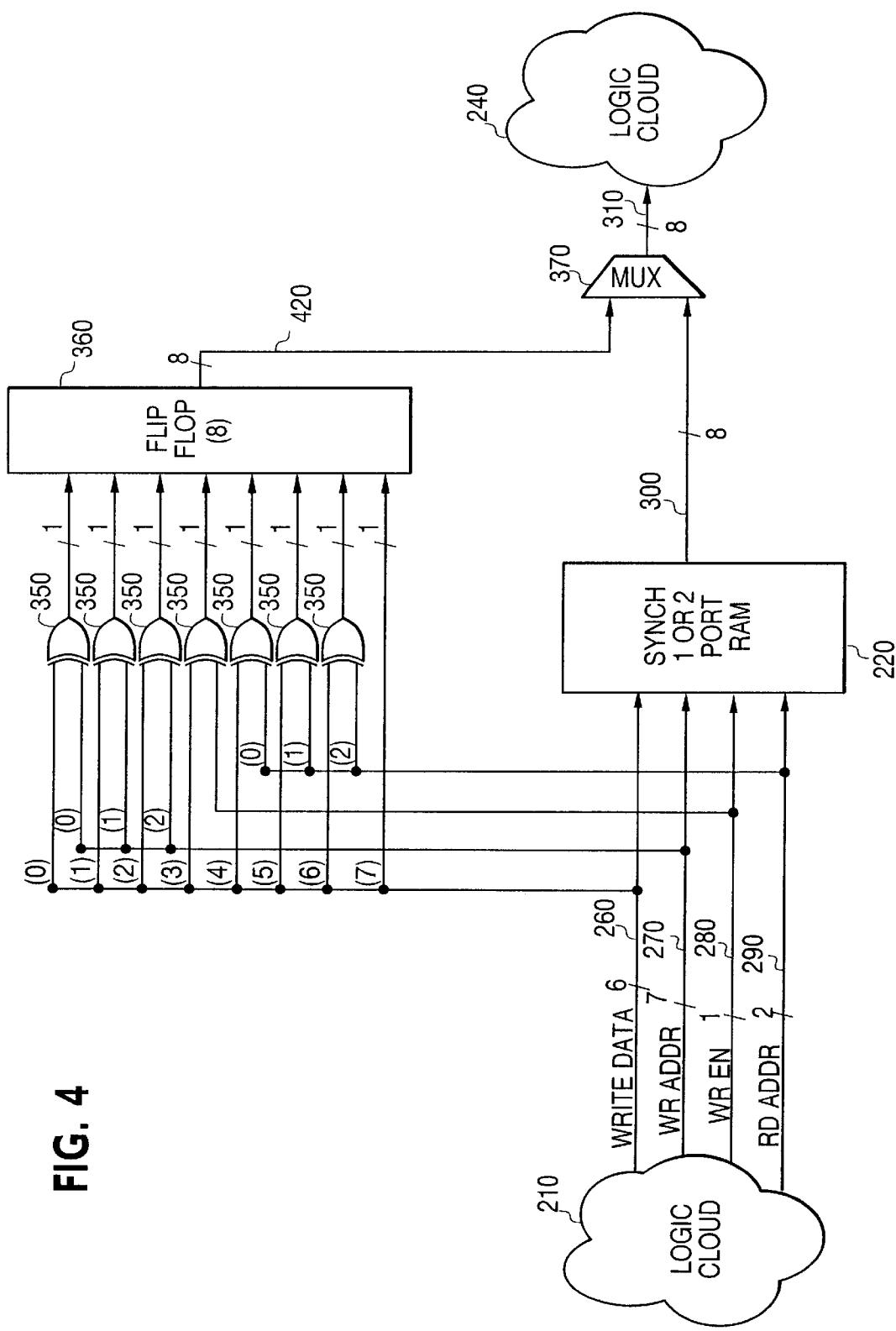
FIG. 4 is a diagram showing further detail of the exclusive OR gates used in the embodiment of the present invention shown in FIG. 3.

FIG. 4 is a diagram showing further detail of the XOR gates 350 used in the embodiment of the present invention shown in FIG. 3. The XOR gates 350 are provided in this embodiment of the present invention in order to receive fifteen bits or signals of input from logic cloud 210 and generate eight bits or signals of output into flip-flop 360. Thereafter, eight bits or signals are provided from flip-flop 360 via link 420 to MUX 370 in a similar fashion as that from RAM 220 via link 300. The need for this bit reduction is that the number of signals or bits entering RAM 220 exceeds that exiting RAM 220 via link 300. Specifically, write data link 260 provides for eight bits of data as needed in a single byte. The write address link 270 requires three bits of data to indicate a memory location in RAM 220. The write enable link 280 requires one bit of data. The read address link 290 requires three bits of data to indicate a memory location in RAM 220. Therefore, 15 bits or signals enter RAM 220 while only eight bits or signals exit RAM 220 via link 300. In order for the scan circuit to operate properly eight bits or signals must enter flip-flop 360 and leave flip-flop 360 via link 420.

In order to accomplish this reduction in bits or signals a total of seven XOR gates 350 are utilized. As shown in FIG. 4, each bit or signal from write data signal 260 is fed into an XOR gate 350 with the exception of the last bit or signal. The first three bits of write data signal 260 are combined with three bits from write address signal 270 in three separate XOR gates 350. An XOR gate 350 will only set its output signal high or equal to one if one and not both of the input signals or bits is set to one or high. The fourth bit of write data link 260 is combined with write enable link 280 in the fourth XOR gate 350. Further, bits 5, 6 and 7 are combined with the bits or signals from read address link 290. The last remaining bit in write data link 260 is directly fed into flip-flop 360 without being combined with another signal or passing through an XOR gate 350.

Using this configuration of XOR gates 350 it is possible to provide eight inputs to flip-flop 360 and eight outputs to MUX 370 via link 420. Therefore, MUX 370 would select eight bits or signals either from link 300 or link 420 and circuit 320 and may be tested using the scan chain with minimal impact to the design of circuit 320.

The benefits resulting from the present invention are that individual circuits in a chip having memory embedded therein may be tested either during design, manufacturing or thereafter with minimal impact on the functionality and performance of the chip. This is accomplished with minimal impact to the hardware design of the chip. Further, minimal space for additional logic required by the present invention on the chip is used. Therefore, chips designed to communicate to other devices or interface to peripheral devices may have all their circuits tested even when onboard embedded memory is present.

While we have shown and described only a few examples herein, it is understood that numerous changes and modifications as known to those skilled in the art could be made in the embodiments of the present invention. Therefore, we do not wish to be limited to the details shown and described herein, but intend to cover all such changes and modifications as are encompassed by the scope of the appended claims.

We claim:

1. A device to test a circuit on a chip having memory using a scan circuit, comprising:
    a memory embedded in the chip, the memory having a plurality of address, data and control inputs, and a plurality of output bits;
    a scan bypass circuit to logically combine at least ones of the plurality of address, data and control inputs to obtain a substantially equal plurality of scan bypass bits as the plurality of output bits output by the memory; and
    a multiplexer connected to receive the plurality of output bits of the memory and the substantially equal plurality of scan bypass bits of the scan bypass circuit, wherein when a scan test is run the multiplexer will multiplex pass the substantially equal plurality of scan bypass bits of the scan bypass circuit and not the output bits from the memory, and when the scan test is not run the multiplexer will multiplex pass the plurality of output bits from the memory and not from the scan bypass circuit.

2. The device as recited in claim 1, comprising a scan pattern checker to apply a known scan pattern to the at least ones of the plurality of address, data and control inputs that will generate an output scan pattern from the multiplexer that may be checked for accuracy, and wherein when the value from the multiplexer does not match an expected output scan pattern, to report a failure for the chip.

3. The device as recited in claim 1, wherein the scan bypass circuit reduces the number of the at least ones of the plurality of address, data and control inputs to obtain the substantially equal plurality of scan bypass bits as the plurality of output bits output by the memory.

4. The device as recited in claim 1, wherein the scan bypass circuit comprises a plurality of exclusive OR gates to logically combine the at least ones of the plurality of address, data and control inputs to obtain the substantially equal plurality of scan bypass bits as the plurality of output bits output by the memory.

5. The device as recited in claim 3, wherein the plurality of address, data and control inputs comprises ones of:
    a write data signal;
    a write address signal;
    a write enable signal; and
    a read address signal.

6. The device as recited in claim 1, wherein the plurality of scan bypass bits from the scan bypass circuit and the plurality of output bits of the memory to the multiplexer are each eight bits in length.

7. A method to test a circuit on a chip having memory, comprising:
    feeding a plurality of scan input signals into memory and a scan bypass circuit that bypasses memory, via a plurality of address, data and control inputs of the memory;
    logically combining at least ones of the plurality of address, data and control inputs in the scan bypass circuit to obtain a substantially equal plurality of scan bypass bits as a plurality of output bits output by the memory;
    using a multiplexer to receive the plurality of output bits of the memory and the substantially equal plurality of scan bypass bits of the scan bypass circuit;
    controlling the multiplexer to multiplex pass the substantially equal plurality of scan bypass bits of the scan bypass circuit and not the output bits from the memory when a scan test is run; and
    controlling the multiplexer to multiplex pass the plurality of output bits from the memory and not from the scan bypass circuit when the scan test is not run.

8. The method as recited in claim 7 comprising:
    comparing the bits passed against an expected value when the scan test is run; and
    reporting an error when the bits do not match the expected value when the scan test is run.

9. The method as recited in claim 7, wherein the scan bypass circuit comprises a plurality of exclusive OR gates used in the logically combing of the at least ones of the plurality of address, data and control inputs to obtain the substantially equal plurality of scan bypass bits as the plurality of output bits output by the memory.

10. The method as recited in claim 7, wherein the plurality of scan bypass bits from the scan bypass circuit and the plurality of output bits of the memory to the multiplexer are each eight bits in length.

11. The method as recited in claim 7, wherein the plurality of address, data and control inputs comprises ones of:
    a write data signal;
    a write address signal;
    a write enable signal; and
    a read address signal.

12. A device to test a circuit on a chip having memory, comprising:
    a memory embedded in the chip, the memory having a plurality of address, data and control inputs, and a plurality of output bits;
    scan bypass circuit means for logically combining at least ones of the plurality of address, data and control inputs to obtain a substantially equal plurality of scan bypass bits as the plurality of output bits output by the memory; and
    multiplexer means for receiving the plurality of output bits of the memory and the substantially equal plurality of scan bypass bits of the scan bypass circuit, wherein when a scan test is run the multiplexer means for multiplex passing the substantially equal plurality of scan bypass bits of the scan bypass circuit and not the output bits from the memory, and when the scan test is not run the multiplexer means for multiplex passing the plurality of output bits from the memory and not from the scan bypass circuit.

13. The device as recited in claim 12, comprising:

comparing means for comparing the bits passed against an expected value when the scan test is run; and reporting means for reporting an error when the bits do not match the expected value when the scan test is run.

14. The device as recited in claim 12, wherein the scan bypass circuit comprises a plurality of exclusive OR gates to logically combine the at least ones of the plurality of address, data and control inputs to obtain the substantially equal plurality of scan bypass bits as the plurality of output bits output by the memory.

15. The device as recited in claim 12, wherein the plurality of scan bypass bits from the scan bypass circuit and the plurality of output bits of the memory to the multiplexer are each eight bits in length.

16. The device as recited in claim 12 wherein the plurality of address, data and control inputs comprises ones of:

a write data signal;

a write address signal;

a write enable signal; and a read address signal.

17. A device to test a circuit on a chip using a scan circuit, comprising:

a sub-circuit portion embedded in the chip, the sub-circuit portion having a plurality of address, data and control inputs, and a plurality of output bits;

a scan bypass circuit to logically combine at least ones of the plurality of address, data and control inputs to obtain a substantially equal plurality of scan bypass bits as the plurality of output bits output by the sub-circuit portion; and a multiplexer connected to receive the plurality of output bits of the sub-circuit portion and the substantially equal plurality of scan bypass bits of the scan bypass circuit, wherein when a scan test is run the multiplexer will multiplex pass the substantially equal plurality of scan bypass bits of the scan bypass circuit and not the output bits from the sub-circuit portion, and when the scan test is not run the multiplexer will multiplex pass the plurality of output bits from the sub-circuit portion and not from the scan bypass circuit.

18. The device as recited in claim 17, wherein the sub-circuit portion is an on-chip memory portion.

* * * * *